United States Patent
Schultz et al.

(10) Patent No.: US 6,641,348 B1
(45) Date of Patent: Nov. 4, 2003

(54) DOCKING STATION FOR SUBSTRATE TRANSPORT CONTAINERS

(75) Inventors: Klaus Schultz, Jena (DE); Alfred Schulz, Jena (DE); Marlies Mages, Jena (DE)

(73) Assignee: Brooks Automation GmbH, Jena (DE)

( * ) Notice: Subject to any disclaimer, the term of this patent is extended or adjusted under 35 U.S.C. 154(b) by 0 days.

(21) Appl. No.: 09/184,561

(22) Filed: Nov. 2, 1998

(30) Foreign Application Priority Data

Mar. 27, 1998 (DE) ......................................... 198 13 684

(51) Int. Cl.⁷ ............................................. B65G 49/07
(52) U.S. Cl. ....................................... 414/217; 414/935
(58) Field of Search ........................... 414/217, 225.01, 414/416, 659, 935, 937, 939, 940

(56) References Cited

U.S. PATENT DOCUMENTS

| | | | |
|---|---|---|---|
| 4,036,376 A | | 7/1977 | Ide |
| 4,815,912 A | * | 3/1989 | Maney et al. ............... 414/217 |
| 5,382,127 A | * | 1/1995 | Garric et al. ............... 414/217 |
| 5,451,131 A | * | 9/1995 | Hecht et al. ............... 414/217 |
| 5,474,410 A | * | 12/1995 | Ozawa et al. ............... 414/217 |
| 5,601,484 A | * | 2/1997 | Adler et al. ......... 414/225.01 X |
| 5,604,443 A | * | 2/1997 | Kitamura et al. ....... 414/416 X |
| 5,605,428 A | * | 2/1997 | Birkner et al. .......... 414/416 X |
| 5,612,781 A | * | 3/1997 | Ohtomo et al. .......... 356/152.2 |
| 5,655,869 A | * | 8/1997 | Scheler et al. .......... 414/940 X |
| 5,772,386 A | * | 6/1998 | Mages et al. ........... 414/937 X |
| 5,834,915 A | * | 11/1998 | Babbs et al. ............ 414/935 X |
| 5,967,740 A | * | 10/1999 | Pflueger et al. ......... 414/659 X |

FOREIGN PATENT DOCUMENTS

| | | |
|---|---|---|
| DE | 4310149 | 3/1993 |
| DE | 4425208 | 7/1994 |
| DE | 19542646 | 11/1995 |
| EP | 0 827 185 | 3/1998 |
| GB | 2235581 | 3/1991 |
| GB | 2291848 | 2/1996 |
| GB | 2307893 | 6/1997 |

OTHER PUBLICATIONS

Patent Abstracts of Japan, Publication No. 08279546 A, Application No. 08068465 (Oct. 1996) (1 page).
Patent Abstracts of Japan, Publication No. 04218942 A, Application No. 03083598 (Aug. 1992) (1 page).

* cited by examiner

*Primary Examiner*—Robert P. Olszewski
*Assistant Examiner*—Gerald J. O'Connor
(74) *Attorney, Agent, or Firm*—Perman & Green, LLP; Richard Pickreign

(57) ABSTRACT

A device for coupling containers at a loading and unloading port with a horizontally displaceable platform for receiving the container has the object of increasing protection against faulty operation and faulty loading in a simple manner while guaranteeing technical cleanroom requirements and without limiting the clear space of the platform. An arrangement for detecting the presence of a container and for distinguishing between containers with different contents is provided for an expectancy area above the platform. The device is used for the loading and unloading at machining or processing stations of objects that are to be transported in a container, especially objects in the fabrication process for integrated circuits.

18 Claims, 6 Drawing Sheets

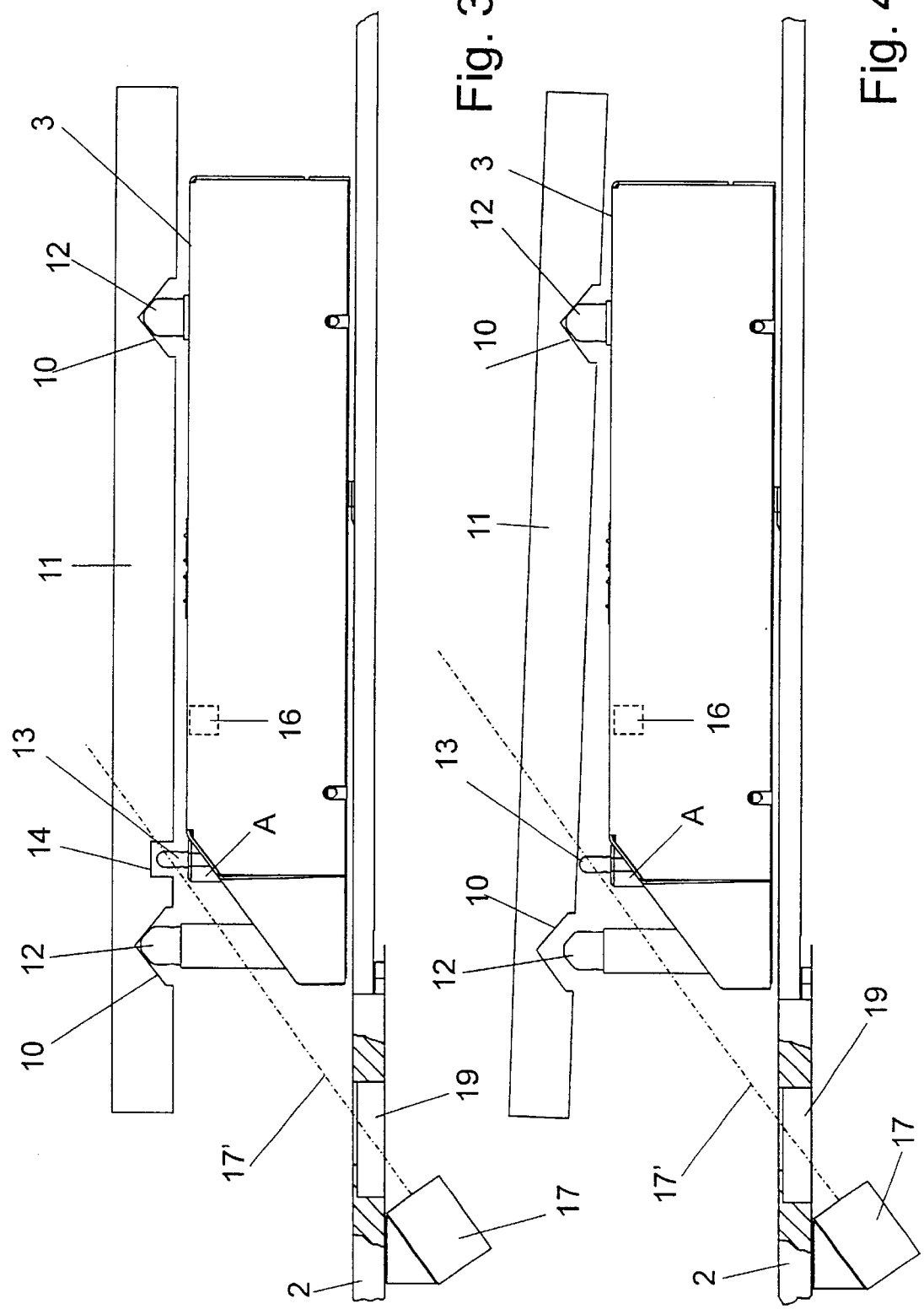

DOCKING STATION FOR SUBSTRATE TRANSPORT CONTAINERS

BACKGROUND OF THE INVENTION a) Field of the Invention

The invention is directed to a device for coupling containers at a loading and unloading port with a horizontally displaceable platform for receiving the container, means for orientation and fastening of the container on the platform, and with a removable closure in the loading and unloading port.

b) Description of the Related Art

For containers used for transporting large objects in the fabrication of integrated circuits, it is known from DE 195 42 646 A1 to deposit these containers on a platform. Alignment elements formed as grooves and as pins engaging in the grooves are usually provided as orientation means in the base of the container and in the platform, wherein these alignment elements are arranged in a three-point formation so as to match one another. For purposes of fixing the container, it is known, on the one hand, to let a beveled peg fastened to the container base at a distance therefrom slide below a stationary contact-pressing arm. On the other hand, a key that is guided through a bore hole in the platform can also be provided. When the transport container is placed on the platform, it penetrates through a keyhole incorporated in a plate fastened at a distance from the container bottom and engages behind this plate after a closing movement.

The latter step has the disadvantage that greater degrees of freedom in orientation, which are often demanded, do not allow for fastening, although the widening of the keyhole is subjected to limitations.

A further disadvantage in the known device consists in that protection against errors when charging the platform with containers can sometimes not be adequately ensured. When the containers are transported and transferred by automatic systems, collisions must be excluded.

OBJECT AND SUMMARY OF THE INVENTION

It is the primary object of the invention to increase protection against faulty operation and faulty loading in a simple manner while guaranteeing technical cleanroom requirements without limiting the clear space of the platform.

According to the invention, this object is met by a device for coupling containers at a loading and unloading port with a horizontally displaceable platform for receiving the container, means for aligning and fastening the container on the platform, and with a removable closure in the loading and unloading port, in that means for detecting the presence of a container and for distinguishing between containers with different contents are provided for an expectancy area above the platform.

The presence of a container is detected in that at least one reflector is provided at least in the vicinity of the loading and unloading port, which reflector directs a beam of at least one transmitter penetrating the expectancy area for the container to at least one receiver. The reflector can be arranged at the closure as well as at the wall element.

The presence of a container can also be detected in that there is provided at least in the vicinity of the loading and unloading port at least one receiver for receiving a beam of a transmitter which penetrates the expectancy area for the container. Like the reflector, the receiver can also be arranged at the closure or at the wall element.

In order to distinguish between containers, the platform has at least one protruding area which enables a reference position on the alignment means in a container suitable for coupling in that these means engage in matching recesses in the base of the container. In a container that is not suitable for coupling, the protruding area causes a deviation from the aligned reference position through the absence of the recess. A sensor below the platform can distinguish between the different distances of the container base from the platform through a window in the platform by means of a distance-selective detection area.

The reflector advantageously has, at the closure, metallically reflecting surfaces which change the polarizing direction of polarized initial or output radiation. Every receiver is suitable only for reception of a beam altered in this way.

It is further advantageous when retaining elements are provided below the platform, which retaining elements project through an opening in the central area of the platform for fastening the container to the platform and grasp the container. Two latches which are adjustable in opposite directions relative to one another about axes of rotation by means of a crank serve as retaining elements.

A hindering of the freedom of movement is ruled out due to the fact that the latches are located below the platform during the advancing feed of the container.

The invention will be explained more fully hereinafter with reference to the schematic drawing.

BRIEF DESCRIPTION OF THE DRAWINGS

In the drawings:

FIG. 3 is a side view of the platform with a partial housing section showing the platform with a container suitable for coupling;

FIG. 4 is a side view of the platform with a partial housing section showing the platform with a container which is not suitable for coupling;

DESCRIPTION OF THE PREFERRED EMBODIMENTS

Figure 1:
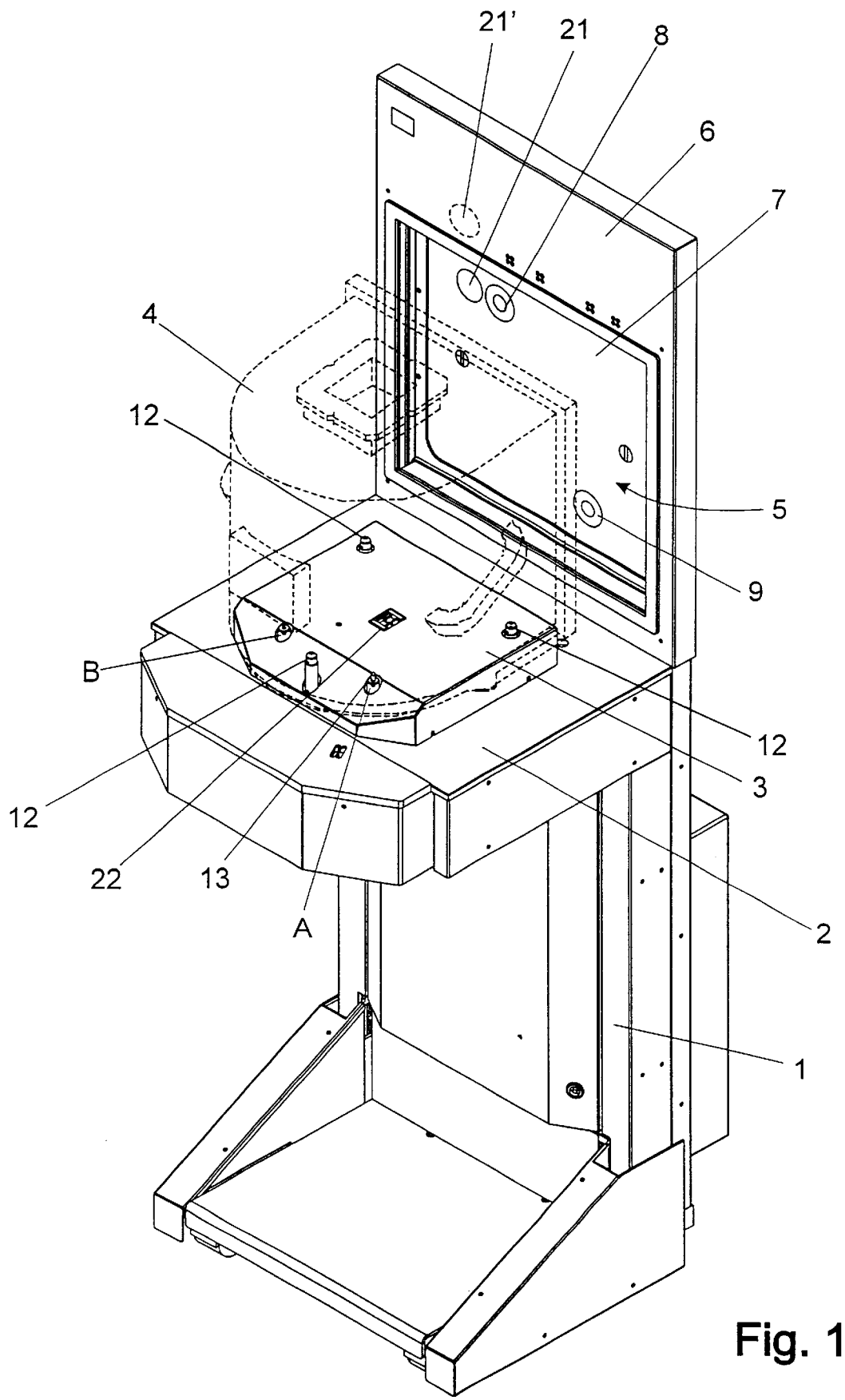
FIG. 1 shows a loading and unloading station in a perspective view.

A loading and unloading station according to FIG. 1 contains, at a supporting frame 1, a housing 2 which is bent in an L-shaped manner and in which are accommodated driving and controlling elements for a horizontally displaceable platform 3. The platform 3 serves to receive containers 4 and to dock or couple the latter at a loading and unloading port 5 in a wall element 6 which is provided with a removable closure 7. For this purpose, the container 4 is connected by its container cover, as is described, e.g., in DE 195 42 646 A1, with the closure 7 in a frictional engagement by means of suction elements 8, 9 through horizontal displacement of the platforms 3 in the direction of the wall element 6. The container cover which is inserted into the container 4, e.g., according to DE 195 35 178 A1, and locked is unlocked after the frictionally engaging connection is produced and is removed together with the closure 7.

Figure 2:
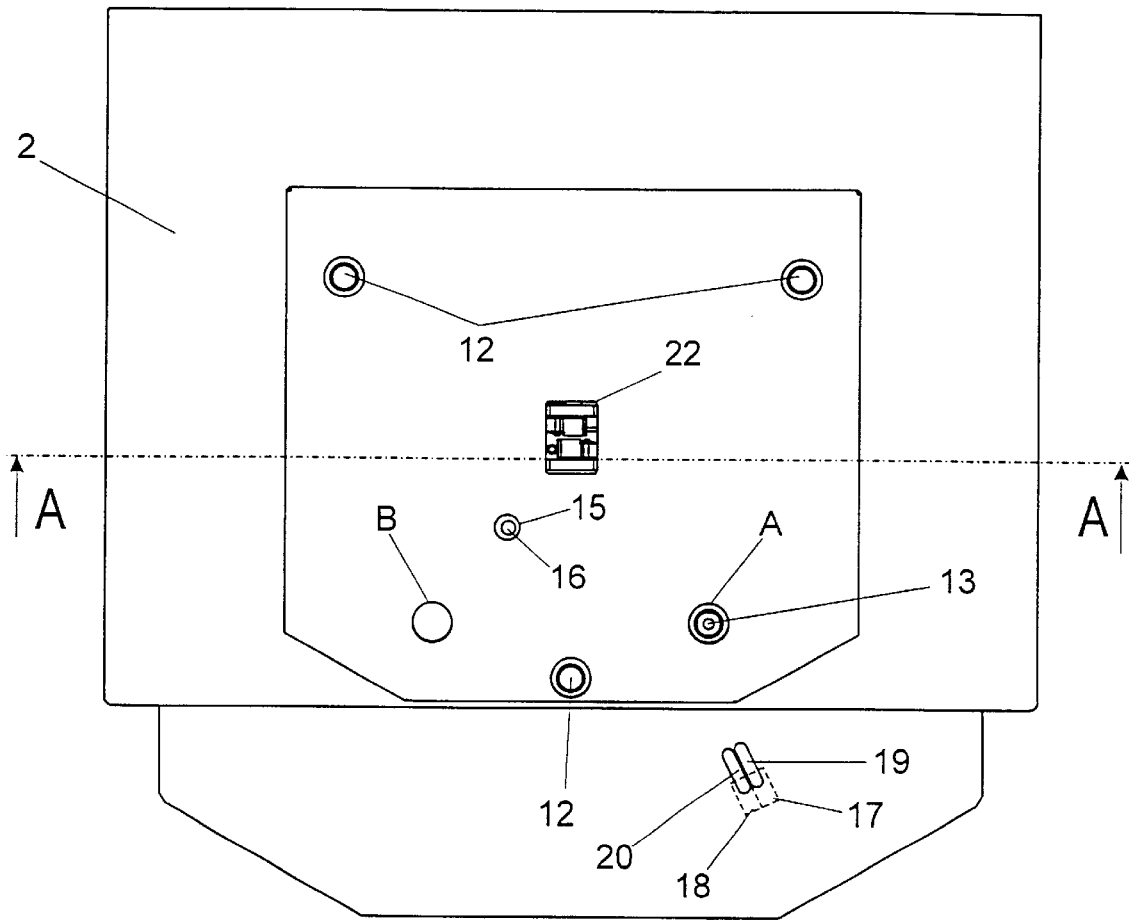
FIG. 2 shows a top view of a platform for receiving a container.

As illustrated in FIGS. 3 and 4, alignment elements formed as grooves 10 in the container base 11 and pins 12 on the platform 3 which engage in these grooves 10 are arranged so as to fit into one another in a three-point formation (see FIG. 2) for the purpose of orientation of the container 4. As can further be seen from FIGS. 2 to 4, the platform 3 also has means for distinguishing between containers in which are accommodated objects that must be processed or machined in various ways after the container 4 docks at the loading and unloading port 5. At least one protruding area on the platform 3 formed as a coding pin 13 which engages in a matching recess 14 in the container base 11 in a container 4 suitable for coupling (FIG. 3) serves as distinguishing means. If the container 4 contains objects whose machining should not be carried out in the manner in which this would be carried out by the machining installation at the loading and unloading station or if the advancing of certain objects out of the loading and unloading station into that type of container is not permissible, no matching recesses are provided in the container base 11. The container base 11 occupies a position (FIG. 4) diverging from the reference position. In the present example, the coding pin 13 can be provided either at a position A or at a position B.

For purposes of detecting the two positions, a window 15 is fashioned in the platform 3 in the region of the greater difference in height. A sensor 16 arranged below the platform looks through this window 15 with background fade-out. The detection area predetermined by this characteristic allows near objects to be seen by the sensor, but more distant objects to disappear from the field of view independent to a great extent from the reflectivity of the object to be detected.

The radiation of a further sensor comprising a transmitter 17 and receiver 18 for detecting the presence of a container 4 penetrates the expectancy area for the container 4 above the platform 3. In order to ensure an unrestricted clear space above the platform 3, the transmitter 17 and receiver 18 are arranged inside the housing 2 in the vicinity of a corner area remote of the loading and unloading port 5, wherein this corner area has openings 19, 20 constructed in a manner suitable for passing radiation. The radiation emitted by the transmitter 17 is advantageously polarized in a predetermined direction and is directed to a reflector 21 at the closure 7 which generates a reflection on the receiver 18. Of course, it is also possible to arrange a reflector 21' at the wall element 6 instead of arranging the reflector 21 at the closure 7. Both reflectors 21 and 21' should be constructed as corner reflectors or triple mirrors to achieve an effective reflection directed to the receiver 18, wherein the use of a triple-mirror foil advantageously minimizes spatial expansion. The radiation 17' is inclined at an angle to the surface of the platform 3 as well as to the wall element 6 and closure 7 for detecting the largest possible space. Further, the reflectors 21 and 21' have metallically reflecting surfaces, so that the reflected radiation has a polarization direction that is altered with respect to the output radiation. Since the containers 4 are usually produced from plastic material and do not cause any change in the polarization direction, the receiver 18 which is adjusted to the altered polarization direction receives only this signal. In this way, the radiation reflected by the reflector 21 can be distinguished from radiation that may possibly be directed from a container 4 to the receiver 18.

Figure 5:
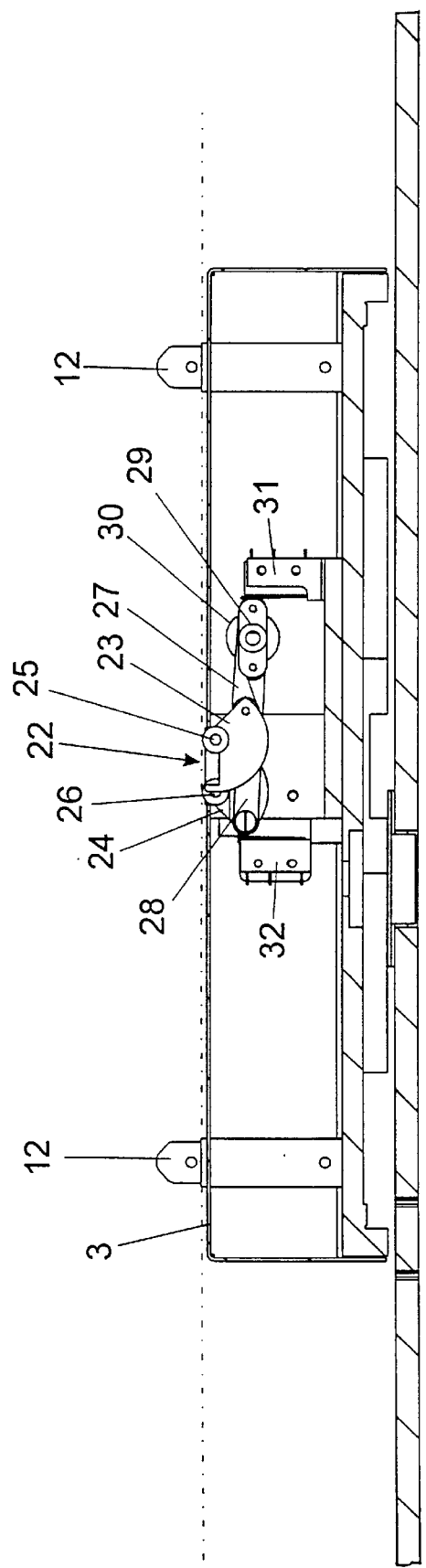
FIG. 5 shows a retaining device for the container which is swiveled in under the platform in a section A—A through the view in FIG. 2.
Figure 6:
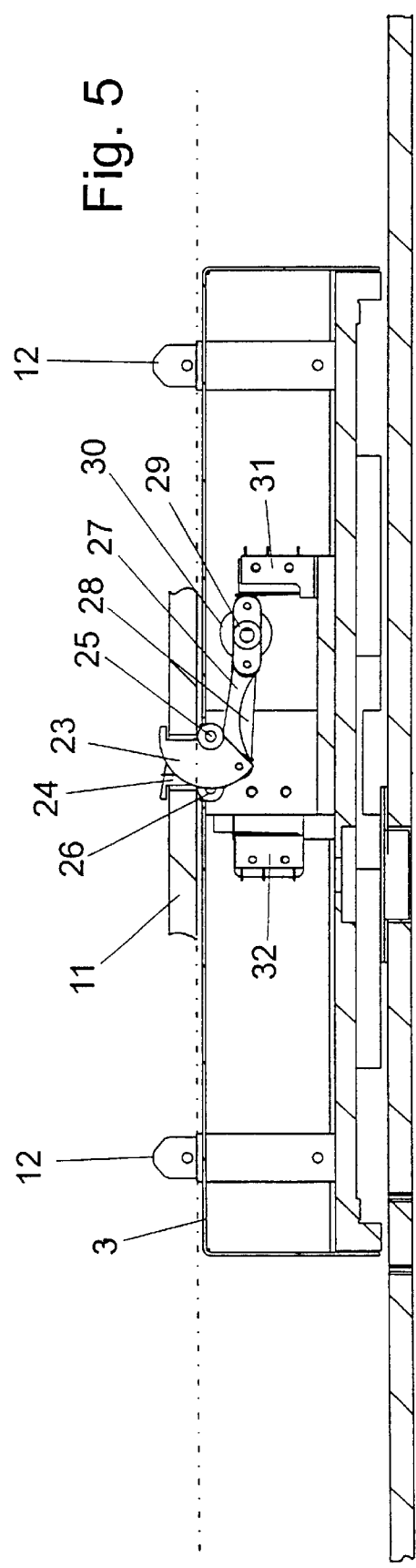
FIG. 6 shows the retaining device according to FIG. 3, wherein the container is held.

After the container 4 is positioned in its reference position on the platform 3, fixing is required so as to ensure the necessary stability during coupling and to prevent unauthorized removal of the container 4. The platform 3 has, in its center, an opening 22 through which retaining elements in the form of two latches 23, 24 project in order to grasp the container 4 (FIGS. 5, 6). Each of the latches 23, 24 is rotatably mounted on a separate pin 25, 26 and connected with a crank 29 via a rocker 27, 28. The rockers 27, 28 are fastened to the crank 29 at crank arms located opposite from one another, so that the latches 23, 24 carry out movements in opposite directions. The construction of the latches 23, 24 ensures in every position that the container 4 will not be impeded in its advance toward the platform 3. The end positions of the cranks 29 driven by a motor 30 are determined by end-position sensors 31, 32.

The grasping of the container 4 starts from an initial situation according to FIG. 5 in which the latches 23, 24 are folded under the platform 3. By turning the crank 29, the latches 23, 24 are rotated about their pins 25, 26 by means of the rockers 27, 28 and emerge from the opening 22. The rotation is carried out until the end-position sensors 31, 32 signal that the position to be detected has been reached. The container 4 which is represented by a section from the container base 11 is fixed in these end positions by the latches 23, 24 (FIG. 6).

Figure 7:
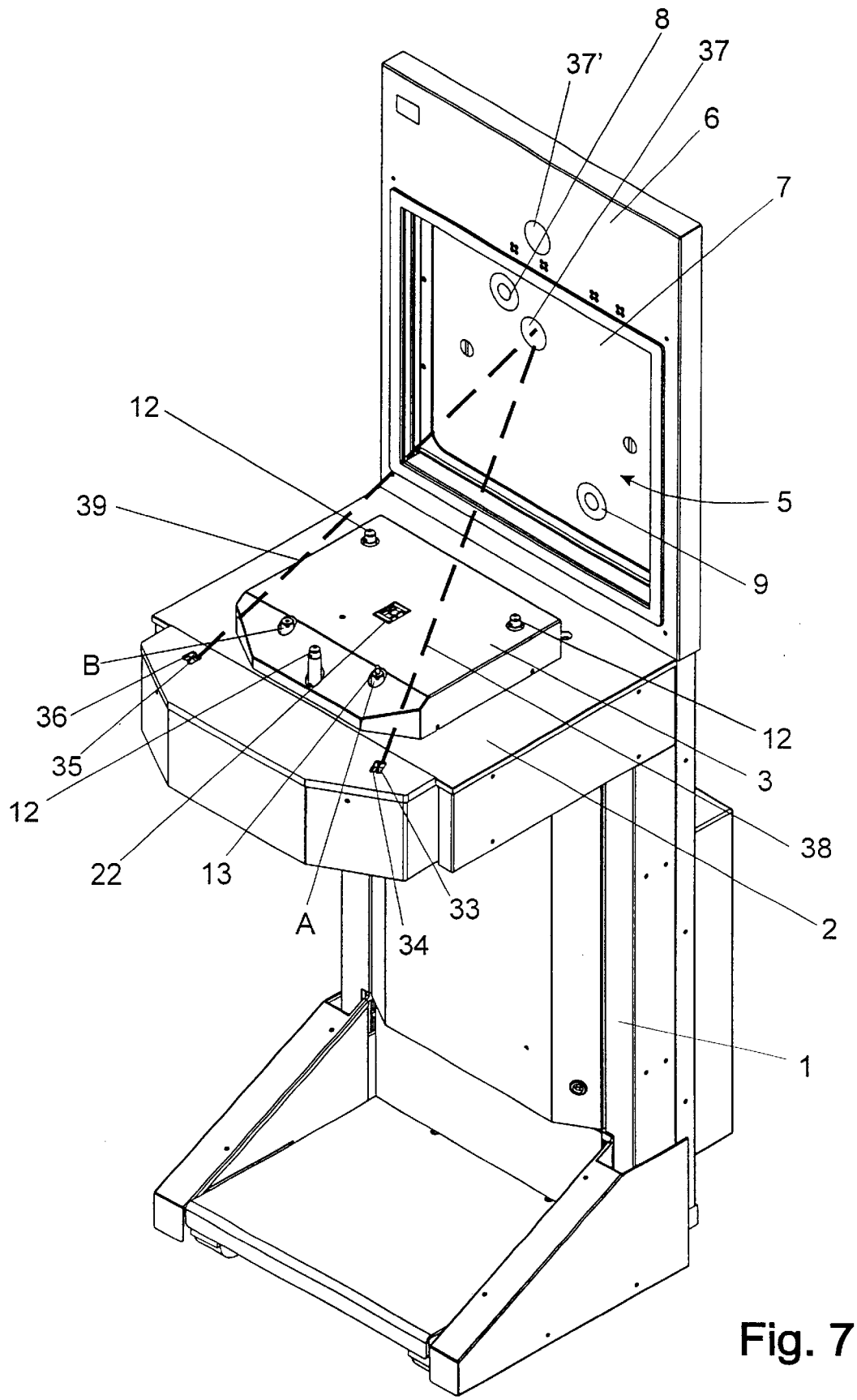
FIG. 7 shows a loading and unloading station with a two-fold sensor arrangement for monitoring the expectancy area for the container.

In the sensor arrangement used in FIG. 7, openings 33, 34, 35, 36 for sensors are provided with adjacently arranged transmitters and receivers in the housing 2 in the vicinity of two corner areas of the platform 3 which are remote of the loading and unloading port 5. A reflector 37 at the closure 7 serves to reflect two beam bundles 38, 39 onto the respective receiver. The reflector 37 can also be replaced by a reflector 37' arranged at the wall element 6.

Of course, for expansion of the monitored space above the platform 3, it is also possible to use sensors whose beam bundles intersect in the expectancy area. Corresponding reflectors must be arranged in an appropriate manner.

Figure 8:
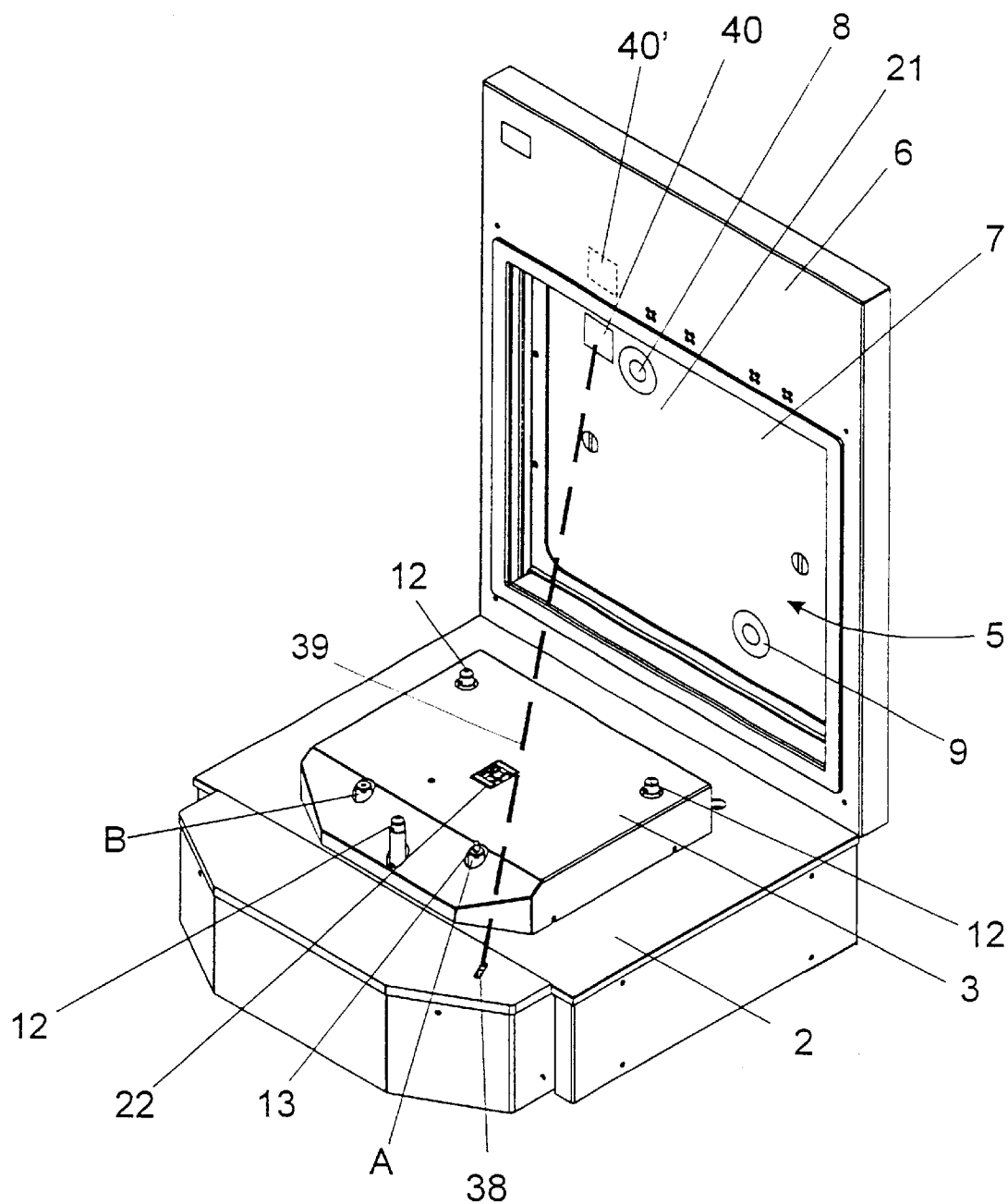
FIG. 8 shows the arrangement of a one-way light barrier for monitoring the expectancy area for the container.

The use of a one-way light barrier for monitoring the expectancy area for the container 4 is provided in the example in FIG. 8, in which an opening 38 is made in the housing 2 only for one transmitter, wherein a light beam bundle 39 is directed through this opening 38 onto a receiver 40 or 40' in the region of the loading and unloading port 5. The receivers 40 and 40' are fastened, alternatively, either at the closure 7 or at the wall element 6.

While the foregoing description and drawings represent the preferred embodiments of the present invention, it will be obvious to those skilled in the art that various changes and modifications may be made therein without departing from the true spirit and scope of the present invention.

What is claimed is:

1. A device for bringing together containers at a port positioned in a wall member, said port adapted for the loading and unloading of said containers, said device comprising:
   a horizontally moveable platform adapted to receive said containers and to bring said containers to said port;
   three supports coupled to said platform said three supports adapted to vertically support and align said containers;
   a removable closure member positioned in said port and adapted to contact said containers and be removed from said port when said containers are moved by said platform; and
   means for detecting the presence of a container and a protrusion adapted to distinguish between containers having different contents, both said detecting means and said protrusion being positioned proximate said platform.

2. The device according to claim 1, wherein at least one reflector is provided at least in the vicinity of the loading and unloading port, which reflector directs a beam from at least one transmitter penetrating the area above said platform for the container to at least one receiver.

3. The device according to claim 2, wherein said reflector is positioned within the area of said closure.

4. The device according to claim 2, wherein said reflector is positioned within the area of said wall member.

5. The device according to claim 1 wherein at least one receiver for receiving a beam of a transmitter which penetrates said area above said platform for said container is provided at least in the vicinity of the loading and unloading port for detecting the presence of a container.

6. The device according to claim 5, wherein said receiver is positioned within the area of said closure.

7. The device according to claim 5, wherein the receiver is arranged at the wall member.

8. The device according to claim 7 wherein radiation emitted by a transmitter is polarized and directed to a reflector positioned at said removable closure member.

9. The device according to claim 7, wherein the reflector has, at the closure, at least one metallically reflecting surface, the radiation of every transmitter is polarized, and in that every receiver is suitable only for reception of a beam with a polarization direction generated by the reflector.

10. The device according to claim 9, wherein retaining elements are provided below the platform, which retaining elements project through an opening in the central area of the platform for fastening the container to the platform and grasp the container.

11. The device according to claim 10, wherein two latches which are adjustable in opposite directions relative to one another about axes of rotation by means of a crank serve as retaining elements.

12. The device according to claim 1 wherein said protrusion comprises at least one protruding member on said platform which engages a matching area positioned on the base of said container when said container is suitable for coupling, whereas in a container that is not suitable for coupling said protruding member causes a deviation from an aligned reference position by contacting said container base, said platform further containing a window for a sensor to detect varying positions of said container, wherein said sensor distinguishes between the different distances of said container from said platform through a distance-selective detection area.

13. A substrate loading and unloading station adapted to open a first container comprising:
    a movable platform;
    container alignment pins coupled to the movable platform;
    a container alignment detector adapted to detect alignment of the first container placed on the movable platform;
    a protrusion coupled to the platform adapted to engage a recess in the first container; and
    a container presence detector adapted to detect presence of any container on the platform;
    wherein, the container alignment detector is adapted to detect misalignment of a second container placed on the moveable platform, wherein the second container does not have the recess, and wherein, the misalignment occurs by contact of the protrusion with the second container because the second container does not have the recess to receive the protrusion.

14. The substrate loading and unloading station according to claim 13 further comprising a retainer coupled to the movable platform, the retainer adapted to fasten the first container to the movable platform.

15. The substrate loading and unloading station according to claim 13 wherein the container alignment detector comprises a reflective optical detector mounted proximate the movable platform.

16. A method of determining a type of substrate container on a platform of a substrate loading and unloading station comprising the steps of:
    sensing presence of a container on the substrate loading and unloading station platform by a first detector; and
    sensing alignment of the container on the platform by a second detector;
    wherein, the platform comprises a coding feature, and a first type of substrate container has a mating feature, and a second type of substrate container does not have a mating feature;
    wherein, the second detector senses a first alignment sensor reading when the first type of substrate container is located on the platform with the coding feature being mated with the mating feature, and wherein, the second detector senses a different second alignment sensor reading when the second type of substrate container is located on the platform with the coding feature contacting the second type of container.

17. The method of claim 16 further comprising the step of fastening the first type of substrate container to the movable platform.

18. A method of opening containers at a substrate loading and unloading station comprising the steps of:
    the method of determining a type of substrate container on a platform of a substrate loading and unloading station of claim 17; and
    opening the first type of substrate container.

* * * * *